(12) United States Patent
Keramat et al.

(10) Patent No.: US 7,852,248 B1
(45) Date of Patent: Dec. 14, 2010

(54) ANALOG-TO-DIGITAL CONVERTER (ADC) WITH REDUCED JITTER SENSITIVITY AND POWER CONSUMPTION

(75) Inventors: Mansour Keramat, San Jose, CA (US); Ali Agah, San Jose, CA (US); Ali Tabatabaei, San Francisco, CA (US)

(73) Assignee: Alvand Technology, Inc., Santa Clara, CA (US)

( * ) Notice: Subject to any disclaimer, the term of this patent is extended or adjusted under 35 U.S.C. 154(b) by 28 days.

(21) Appl. No.: 12/331,369

(22) Filed: Dec. 9, 2008

(51) Int. Cl.
*H03M 3/00* (2006.01)
(52) U.S. Cl. ...................... 341/143; 341/155
(58) Field of Classification Search ................ 341/161, 341/143, 155, 144
See application file for complete search history.

(56) References Cited

U.S. PATENT DOCUMENTS

| | | | | |
|---|---|---|---|---|
| 6,518,893 B1* | 2/2003 | Robinson | ................. | 341/56 |
| 6,693,572 B1* | 2/2004 | Oliaei et al. | ................. | 341/143 |
| 7,158,064 B2* | 1/2007 | Jensen | ................. | 341/143 |
| 7,256,724 B2* | 8/2007 | Lee | ................. | 341/169 |
| 2005/0238123 A1* | 10/2005 | Ranganathan et al. | ....... | 375/343 |

\* cited by examiner

*Primary Examiner*—Peguy JeanPierre
(74) *Attorney, Agent, or Firm*—Maryam Imam; IPxLAW Group LLP

(57) ABSTRACT

In one embodiment of the present invention, at least at one stage of a Sigma-Delta analog-to-digital converter (ADC) is disclosed to include means for receiving a voltage at least one of the inputs of an operational amplifier, the operational amplifier having at least one output coupled to the at least one of the inputs via an at least one integration capacitor, means for transforming the voltage to a current and means for integrating the current on the at least one of the integration capacitors, during integration time and varying the resistance of at least one of a variable resistors coupled to the operational amplifier during integration time.

18 Claims, 6 Drawing Sheets

ANALOG-TO-DIGITAL CONVERTER (ADC) WITH REDUCED JITTER SENSITIVITY AND POWER CONSUMPTION

BACKGROUND OF THE INVENTION

1. Field of the Invention

The present invention relates generally to the field of analog-to-digital converters (ADCs) and more particularly, to Sigma-Delta ADCs with reduced jitter sensitivity and power consumption.

2. Description of the Prior Art

With the advent of the digital age, technology has rapidly advanced in the recent decades. One of the results of this growth is faster digital products and with greater accuracy. As digital circuits require higher accuracy, resolution requirements need be increased. Analog-to-digital converters (ADCs), which convert an analog signals to digital form similarly have requirements for higher resolution because they need to keep up with the requirements of digital circuits, as they provide the digital signals employed by their corresponding digital circuits.

Some ADC designs use various operational amplifier circuits with each amplifier circuit comprising a stage of the ADC. Sigma-delta type of ADCs are commonly employed by the industry and at every stage, they typically use an operational amplifier circuit.

The operational amplifier circuit includes an operational amplifier with a feedback path. The feedback path typically comprises an integration capacitor coupled between the output of the amplifier and an input of the amplifier with a remaining input of the amplifier being coupled to an alternating current (AC) ground. To this end, there are two known ways of implementing Sigma-Delta ADCs. One is using continuous-time (CT) feedback approach and another is using discrete-time feedback (or switched-capacitor (SC) feedback) approach.

The CT feedback approach generally uses a current source coupled to the input of the amplifier to which the integration capacitor is coupled, essentially serving to integrate the charge onto the integration capacitor for a corresponding stage. The current source provides a constant current level across the integration capacitor when the integration capacitor is being charged and when integration stops, undesirably, jitter results. An input voltage, Vi, is provided as input to the stage of the ADC and a resistor is used to translate the input voltage to current that essentially integrates on the integration capacitor. The distinguishing feature between the CT feedback and the SC feedback approaches is the feedback path in that the former, feedback is continuous in time and in the latter, feedback is discontinuous or switched.

The feedback factor, $Q_{FB}$, in the continuous-time case is determined by the total charge integrated:

$$Q_{FB} = \frac{I_{FB}T}{2} \qquad \text{Eq. (1)}$$

where $I_{FB}$ is the current generated by the feedback current source and T/2 represents integration time used for integrating the feedback signal as well as the in-coming analog signal.

A plot of the feedback charge, $Q_{FB}$, versus time, t, is shown in FIG. 1. FIG. 1 shows a graph of current versus time and the integration of the $I_{FB}$ pursuant to a continuous-time (CT) Sigma-Delta feedback technique used a prior art ADC design.

As shown in FIG. 1, at approximately the time, T/2, or integration cycle, the feedback signal faces some uncertainty due to jitter or uncertainty in the clock edge.

Therefore, the CT design approach, while being fairly low in its power consumption, suffers from being extremely sensitive to clock jitter. Jitter results from uncertainty at the end of the integration (or sampling) time due to the uncertainty in the clock edge. This is shown in FIG. 1 and represented by the following equation:

$$\Delta Q_{FB} = I_{FB} t_j \qquad \text{Eq. (2)}$$

Where $t_j$ represents variation (or change) at then integration stop time (or the end of the integration time) and $\Delta Q_{FB}$ is the corresponding change in the feedback charge. The corresponding input-referred noise of the stage is shown in the following equation:

$$v_{ninp} = \frac{\Delta Q_{FB}}{R_{in}T} = \frac{I_{FB}t_j}{R_{in}T} \qquad \text{Eq. (2-a)}$$

In the graph of FIG. 1, the y-axis represents current across the integration capacitor and the x-axis represents time. The current rises up to $I_{FB}$ during a time duration of T/2, however on or about time T/2 when integration cycle ends, the time jitter effect undesirably causes sampling inaccuracy. Stated differently, the change in $Q_{FB}$ causes an undesirable jitter time effect. In lower-end ADCs jitter sensitivity may be acceptable, however, higher resolution ADCs cannot tolerate such sensitivity.

In the case of the SC feedback, a feedback capacitor is employed in place of the current source to accumulate a capacitive charge redistribution of a predetermined amount of charge onto the integration capacitor. Thus, current is not maintained at the same level, rather, current spikes up at the outset to discharge the integration capacitor and exponentially reduces thereafter. While discharging at the outset is desirable because it avoids jitter sensitivity at integration stop time, power consumption is increased due to the greater current requirement. Accordingly, in the SC feedback approach, while the jitter sensitivity realized in the CT feedback approach is considerably mitigated due to smaller residue current at the end of the integration cycle (at t=T/2), power consumption is undesirably greater. The increase in power consumption is due to the burden the large current requirement of this approach places on the operational amplifier resulting in chip power penalties.

This is perhaps better understood with reference to FIG. 2. FIG. 2 shows a graph of current versus time and the integration of the $I_{FB}$ pursuant to a switched-capacitor (SC) Sigma-Delta feedback technique used a prior art ADC design. More specifically, the y-axis represents current through the integration capacitor and the x-axis represents time. At the outset, current is at its maximum value of $I_{max}$ and reduces exponentially over time to finally reach zero or thereabout at T/2. Current being low at T/2 makes an SC feedback ADC suitable for low-jitter sensitivity and therefore for high resolution applications, however, power consumption suffers because of the increase needed to increase current at the outset. The feedback charge, $Q_{FB}$, is the integration of $I_{FB}$ over time.

In the SC feedback approach, jitter relaxation factor (D) is defined by the following equation:

$$D = \frac{I_{FB}}{I_{min}} \qquad \text{Eq. (3)}$$

Where $I_{min}$ is the value of current at $t=T/2$

D essentially represents a ratio of jitter sensitivity. Thus, jitter sensitivity is improved by D, in the SC feedback approach over the CT feedback approach. For a fair comparison of the SC and CT feedback techniques, the shaded areas in each of the FIGS. 1 and 2 should be substantially equal such that the integration capacitor in each case is discharged with the same amount of charge over the same integration time.

The total charge transferred during feedback ($Q_{FB}$) is determined by the following equation:

$$Q_{FB} = I_{FB} \cdot \frac{T}{2} = \int_0^{T/2} i(t)dt = \tau I_{max} e^{-t/\tau} \Big|_{T/2}^{0} = I_{max}\tau(1 - e^{-T/2\tau}) \qquad \text{Eq. (4)}$$

Where $I_{FB}$ is the equivalent constant feedback current, and $\tau$ is the time-constant of the discharge in the SC feedback case, $\int_0^{T/2} i(t)dt$ represents the integration of i over time and $I_{max}\tau(1-e^{-T/2\tau})$ represents the resulting exponential function.

Using Eq. (4), D can be represented by the following equation:

$$D = \frac{2\tau}{T}(e^{T/2\tau} - 1) \qquad \text{Eq. (5)}$$

from which $\tau$ is obtained given the target D.

Another useful parameter for comparison of the two different feedback cases is the operational amplifier current over-design factor ($\gamma$) which can be calculated as:

$$\gamma = \frac{I_{max}}{I_{FB}} = \frac{T}{2\tau} \cdot \frac{1}{(1 - e^{-T/2\tau})} \qquad \text{Eq. (6)}$$

Considering that $$\tau \ll \frac{T}{2}$$

this factor can be significant. In the event the operational amplifier cannot provide the maximum current $I_{max}$, it goes into a slewing mode creating nonlinearity, which is clearly undesirable as it results in degradation of the ADC performance. To provide the maximum current, $I_{max}$, power requirements increase, which is clearly a disadvantage.

Therefore, the need arises for a Sigma-Delta ADC having reduced jitter sensitivity while maintaining power consumption low.

SUMMARY OF THE INVENTION

Briefly, one embodiment of the present invention includes at least at one stage of a Sigma-Delta analog-to-digital converter (ADC) having means for receiving a voltage at least one of the inputs of an operational amplifier, the operational amplifier having at least one output coupled to the at least one of the inputs via an at least one integration capacitor, means for transforming the voltage to a current and means for integrating the current on the at least one of the integration capacitors, during integration time and varying the resistance of at least one of a variable resistors coupled to the operational amplifier during integration time.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE PREFERRED EMBODIMENT

The present invention generally describes a Sigma-Delta analog-to-digital converter (ADC) particularly suitable for applications requiring high resolution. In one embodiment of the present invention, the Sigma-Delta analog-to-digital converter ADC is a Sigma-delta type of ADC. In at least one stage of the Sigma-Delta analog-to-digital converter ADC, a variable resistor to control the integration time of an integration capacitor that is coupled across an operational amplifier where at the beginning of an integration cycle, the variable resistor is set to a maximum resistance to limit the amount of requisite charging current thereby relaxing the current requirement of the operational amplifier and as the integration cycle continues, the resistance of the variable resistor is decreased such that the charging current is minimized toward the end of the integration cycle to reduce jitter sensitivity. The Sigma-Delta analog-to-digital converter ADC exhibits low jitter sensitivity as well as low power consumption.

An example of an Sigma-Delta analog-to-digital converter ADC of the present invention is shown and discussed relative to the various embodiments of the present invention, however, it should be understood that these figures and discussion are merely examples of the present invention and other implementations or forms of Sigma-Delta analog-to-digital converter ADC are anticipated without departing from the scope and spirit of the present invention.

Figure 1:
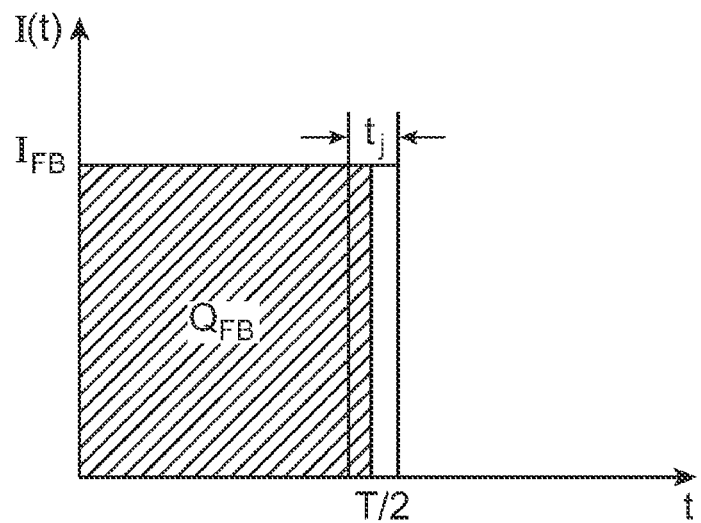
FIG. 1 shows a graph of current versus time and the integration of the $I_{FB}$ pursuant to a continuous-time (CT) Sigma-Delta feedback technique used a prior art ADC design.
Figure 2:
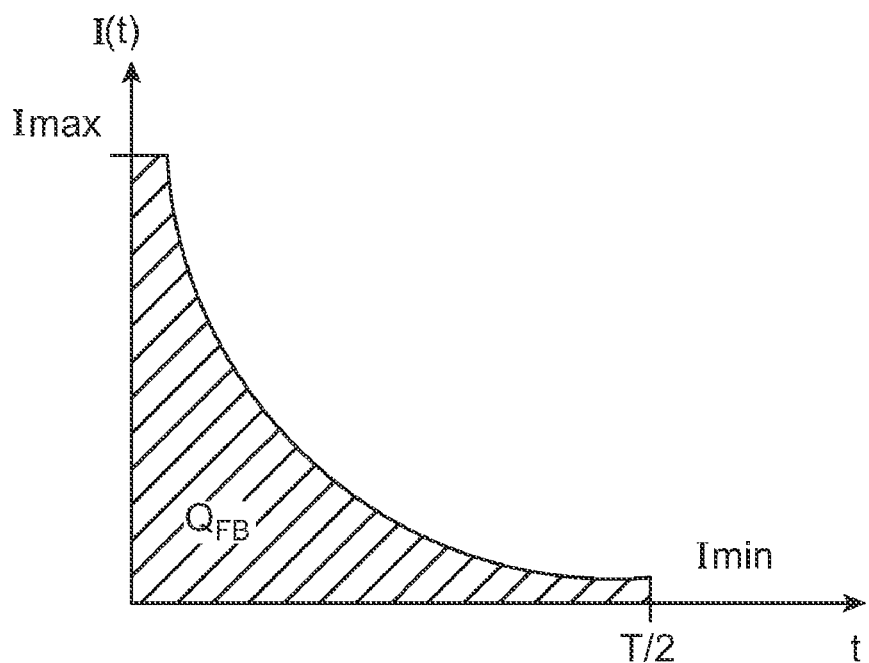
FIG. 2 shows a graph of current versus time and the integration of the $I_{FB}$ pursuant to a switched-capacitor (SC) Sigma-Delta feedback technique used a prior art ADC design.
Figure 3:
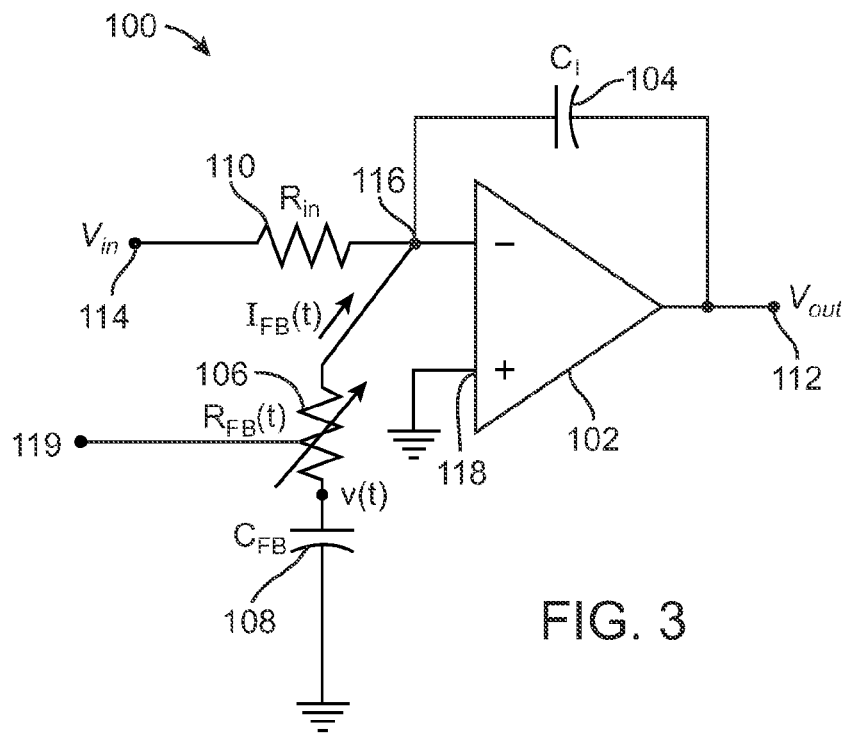
FIG. 3 shows one stage of a Sigma-Delta analog-to-digital converter (ADC) 100 is shown, in accordance with an embodiment of the present invention.

Referring now to FIG. 3, one stage of a Sigma-Delta analog-to-digital converter (ADC) 100 is shown, in accordance with an embodiment of the present invention. The ADC 100 may be an operational amplifier circuit. In one embodiment of the present invention, the ADC 100 is one stage of a Continuous-Time Sigma-Delta type of converter. The ADC 100 is shown to include an operational amplifier 102, an integration capacitor 104, a variable feedback resistor 106, a feedback capacitor 108 and an input resistor 110.

The amplifier 102 has two input nodes 116 and 118. The input to the ADC 100 is an analog input 114 and the output of the ADC 100 is 112. The capacitor 104 is shown coupled at one end to the output 112 and at another end, to the node 116. The resistor 110 is shown coupled at one end to the input 114 and at another end to the node 116. The node 118 of the amplifier 102 is shown coupled to an AC ground. The resistor 106 is shown coupled at one end to the capacitor 108 and at another end to the node 116. The capacitor 108 is shown coupled to an AC ground at an end thereof that is not coupled to the resistor 106. Thus, the capacitor 108 and the resistor 106 are coupled in series.

It is understood that the input 114 is in analog form and the function of the embodiment of FIG. 3 is to convert the analog form of the input 114 to a digital form although the output 112 is in analog form until converted to digital form by circuitry known to those skilled in the art.

In operation, as a voltage is applied through the input 114, it is translated into a current through the resistor 110 and the resulting current, namely the feedback current, $I_{FB}(t)$, is used to integrate the capacitor 104. The operational amplifier 102 serves to amplify the voltage difference at nodes 116 and 118 to that of the output 112. The feedback current, $I_{FB}(t)$, which changes over time in response to the change in resistance of the resistor 106, is set to reach a value $I_{FB}$ at the outset of the integration time and is maintained substantially at the same level during most of the integration time by adjusting the resistance of the resistor 106 i.e. as the integration cycle continues, the resistance of resistor 106 is decreased in such a way that the current $I_{FB}$ does not change substantially.

The resistor 106, in one embodiment of the present invention, is programmably changed in its resistance value. During an integration cycle, the resistance of the resistor 106 is changed in a manner to limit the current at the outset by setting the resistance to a substantially maximum value, which effectively slows down the discharging of the capacitor 104 and to reduce the resistance value of the resistor 106 throughout the remainder of the integration cycle to reach substantially a zero-resistance value at the end of the integration cycle (integration stop cycle) where current is reduced to zero to avoid jitter sensitivity. In this manner, the ADC 100 advantageously functions as a hybrid between the SC feedback approach and the CT feedback approach maintaining and combining the benefits of each approach in that at the beginning of the integration cycle, the ADC 100 utilizes higher current while current is minimized at the end of the integration cycle.

The ADC uses a hybrid of the CT and SC feedback approaches where rather than spiking up the current to a maximum level at the outset, such as done by the SC feedback approach, current level is limited to less than the maximum current so as to avoid requiring a high power consumption in the operational amplifier and as integration stop cycle approaches, minimizing current to avoid jitter sensitivity.

It is understood that the embodiment of FIG. 3 shows one stage of the ADC 100 and that other stages are typically included for an ADC having more than one stage of FIG. 3 is replicated in parallel as many times as needed depending on the ADC architecture.

Figure 4:
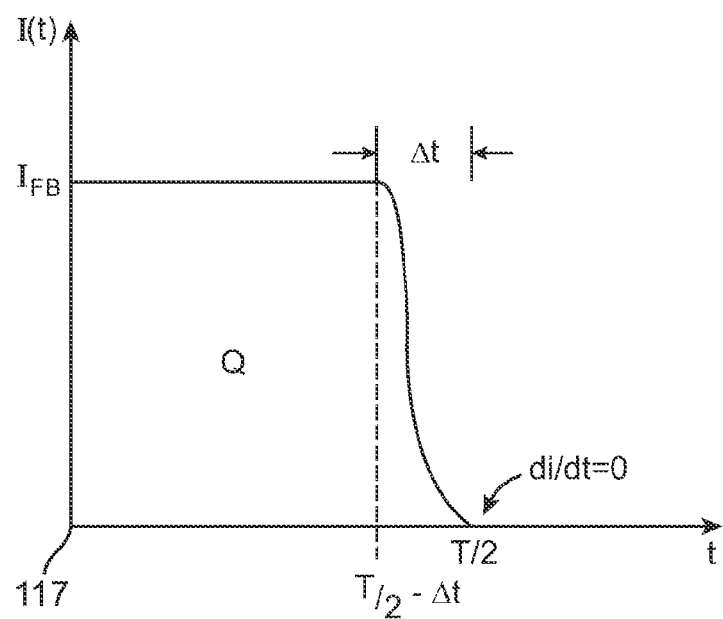
FIG. 4 shows a graph of the behavior of integration current as a function of time, or the change in the integration current, as it relates to the behavior experienced by the embodiment of FIG. 3.

FIG. 4 shows a graph of the behavior of integration current as a function of time, or the change in the integration current, as it relates to the behavior experienced by the embodiment of FIG. 3. The x-axis represents time, t, and the y-axis represents current, I(t). As shown in FIG. 3, during the initial phase of integration time, current is kept fixed at $I_{FB}$ and effectively substantially maintained at this level until T/2 minus $\Delta t$, with $\Delta t$ representing the difference in time between T/2 and a predetermined time before T/2 when the current is reduced by the resistance of the resistor 106 to being substantially zero. At time T/2, the change in current is substantially zero. The graph of FIG. 4 shows an optimal or ideal charge, Q, transfer of the capacitance 104 while practically, the graph of FIG. 4 is not likely realized, rather, a behavior close to it is realized, as will be shown and discussed relative to subsequent figures.

To summarize, in FIG. 4, at an initial integration cycle 117, the resistance, $R_{FB}$, of the variable resistor 106 is set to a maximum value defining a reduced level of feedback current to be applied to the capacitor 104, then, the level of the feedback current throughout the integration cycle is substantially maintained up to a time that is a predetermined amount of time prior to the end of the integration cycle, or $\Delta t$, and toward the end of the integration cycle, the resistance, $R_{FB}$, of the resistor 106 is reduced to substantially zero to finish the discharge process.

Equations representing the behavior at some of the nodes of the ADC 100 are now presented and discussed.

Assuming a current over-design factor (y=1) and that the capacitor 104 is completely discharged at t=T/2:

$$I_{FB} = C_{FB}\frac{dv}{dt} = \frac{v_{out}}{T/2} \qquad \text{Eq. (7)}$$

And $$v(t) = v_{out}\left(1 - \frac{t}{T/2}\right) \qquad \text{Eq. (8)}$$

Where $C_{FB}$ represents the capacitance of the capacitor 104 and v(t) and dv/dt, represent the voltage and the rate of change of voltage (derivative) across the capacitor 104. The optimal $R_{FB}(t)$, which represents the resistance of the resistor 106 over time, can therefore be calculated as:

$$R_{FB}(t) = \frac{v(t)}{I_{FB}} = \frac{1}{C_{FB}}\left(\frac{T}{2} - 2\right) \qquad \text{Eq. (9)}$$

In accordance with one embodiment of the present invention, changing $R_{FB}(t)$ according to the Eq. (9), while keeping the current over-design factor close to 1 (i.e. with no current penalty), advantageously results in the jitter relaxation factor, D, being as large as a factor of 10.

From a practical perspective, the curve of the current shown in FIG. 4 is an ideal curve that cannot be realized by practical implementations. Accordingly, in an alternative embodiment, $R_{FB}(t)$ is changed in a stepwise fashion to resemble the optimal curve of the current in FIG. 4 to the extent allowed by practical designs.

Figure 5:
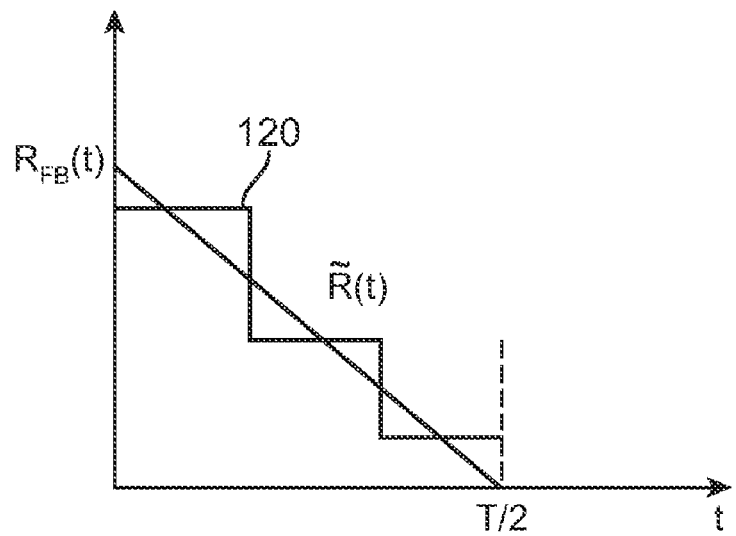
FIG. 5 shows the step-like line 120 of $R_{FB}$ (shown at the y-axis) versus time, t, shown at the x-axis.

FIG. 5 shows the step-like line 120 of $R_{FB}$ (shown at the y-axis) versus time, t, shown at the x-axis, representing an example where n=3 (or three resistors), n being the number of resistors employed and therefore the number of steps. The number of steps, n. is shown to comprise the line 120, with each step representing a unique resistance. Thus, the graph of FIG. 5 shows three different resistances, although, it is understood that any number of resistances may be employed. The more resistors employed, the more the line 120 resembles the optimal curve of FIG. 4 resulting in better control over the feedback current. A number of resistances between 3-5 seems favorable for today's practical implementation. The straight line in FIG. 5 represents the optimal resistance change copied from FIG. 4. Ideally, the resistance of the resistor 106 is changed in a linear fashion, however, real-world limitations do not readily allow for such a smooth change. Rather, the change of resistance when using various resistors, as shown and discussed relative to a subsequent figure, occurs more abruptly or non-linearly, which is the reason for the shape of line 120.

Figure 6:
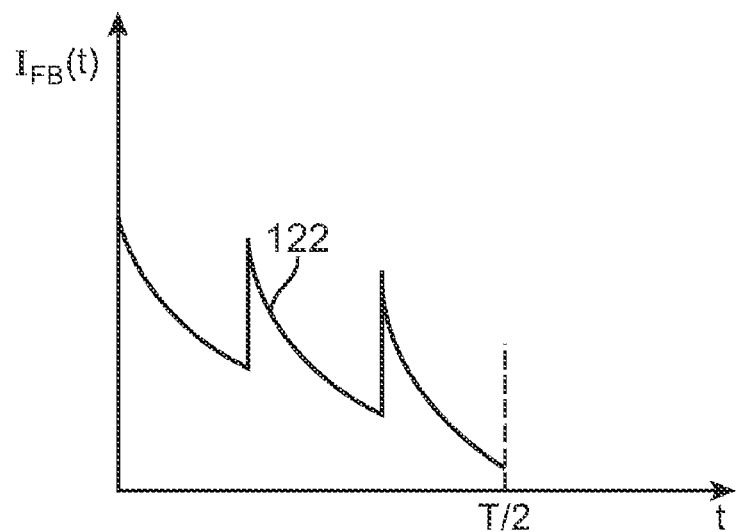
FIG. 6 shows a graph 122 of the $I_{FB}(t)$ corresponding to the step-wise resistors of FIG. 5.

FIG. 6 shows a graph 122 of the $I_{FB}(t)$ corresponding to the step-wise resistors of FIG. 5. The y-axis shows $I_{FB}$ over time, t, or $I_{FB}(t)$, and the x-axis shows time, t, corresponding to the resistance step-wise resistance changes of FIG. 5.

Using such step-wise implementation, a jitter relaxation factor (D) of about 2-5 is achieved while keeping the current over-design factor close to 1 (i.e. with no current penalty).

Figure 7:
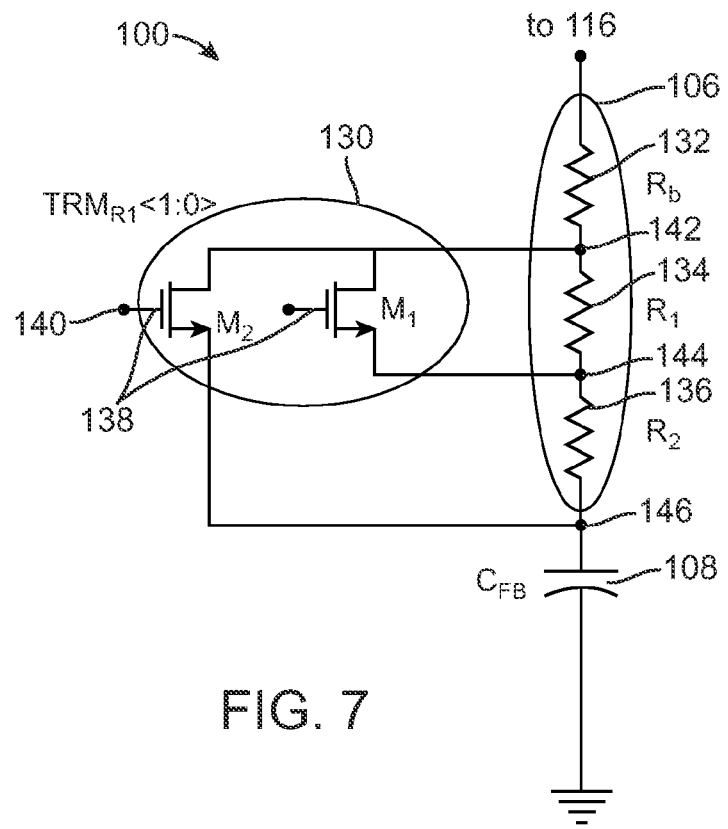
FIG. 7 shows further details of the Sigma-Delta analog-to-digital converter ADC 100, in accordance with an embodiment of the present invention.
Figure 8:
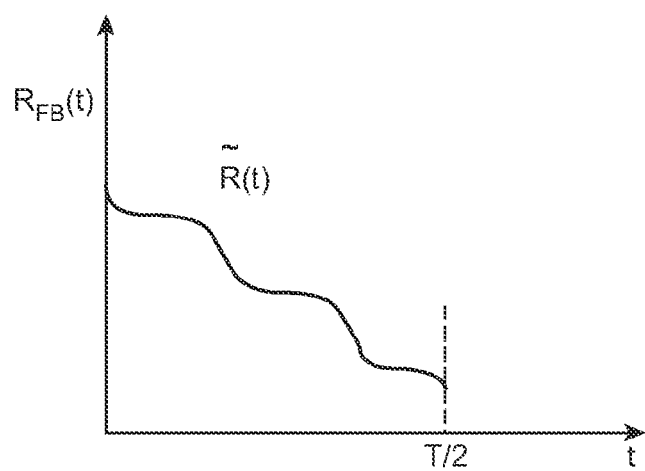
FIG. 8 shows the change in resistance of the resistor 106 (shown by the y-axis) as a function of time (shown by the x-axis) when employing soft-switching.

FIG. 7 shows further details of the ADC 100, in accordance with an embodiment of the present invention. The ADC 100 is shown to include a programmable control logic 130 coupled to the resistor 106 and the capacitor 108, in accordance with an embodiment of the present invention. The resistor 106 is shown to comprise three resistors 132, 134 and 136. The logic 130 is shown to comprise two transistors (also known as switches) 138 and 140. It is understood that while three resistors and two switches are shown, any number of resistors and switches or any combination thereof may be employed without departing from the scope and spirit of the present invention.

In FIG. 7, the resistor 132 is shown to be coupled to the resistor 134 at node 142 at one end thereof and to node 116 at another end thereof. The resistor 134 is shown coupled to the resistor 136 at node 144 at one end thereof and to the capacitor 108 at node 146 at another end thereof. In this manner, the resistors 136, 134 and 132 are coupled in series. The transistors M1 and M2 are each shown to include a source, a drain and a gate. The gate 138 of the transistor M1 and the gate 140 of the transistor 140 comprise a control signal (TRM) used to turn each of the transistors M1 and M2 on and off. The control signal, TRM, is programmable changed represented by bits to turn on and off the transistors M1 and M2. Thus, the control signal, is 'n' number of bits, 'n' being an integer. The control signal in FIG. 7 is shown to be two bits to control two transistors but clearly, the more number of transistors employed, the greater the number of bits needed in the control signal. In FIG. 7, when the most significant bit is a '1' logic state and the least significant bit is a '0' logic state, the transistor M2 is turned on and the transistor M1 is turned off. When both bits are '0', both transistors are turned off. When the least significant bit of the control signal is '1' and the most significant bit is '0', the transistor M1 is turned on and the transistor M2 is turned off and when both bits are '1', both transistors are turned on.

Controlling the transistors M1 and M2 determines the resistance of the resistor 106. For example, when the transistor M2 is 'on' and the transistor M1 is either 'on' or 'off', the resistance of the resistor 106 is determined by the resistance of the resistor 132, which is Rb. When the transistor M1 is 'on' and the transistor M2 is 'off', the resistor 106 is determined by the combined resistance of the resistors 132 and 136, which is Rb+R2, as the resistance of the resistor 136 is R2. When both transistors M1 and M2 are 'off', the resistor 106 is determined by the combined resistance of the resistors 132, 134 and 136, which is Rb+R1+R2, as the resistance of the resistor 134 is R1 and so on.

The stepwise implementation shown in FIG. 7 and graphed in FIGS. 5 and 6, can be further modified by soft-switching the control transistors $M_1$ and $M_2$. Soft-switching is performed by slowing down the on and off slopes of the control signals 138 and 140. In this scheme instead of sharply switching the control transistors on or off the process is done much slower intentionally. As a results instead of a swift change in resistance as shown in FIG. 5, the change in resistance will be with a smoother gradient. The slowing down of the control signals is done by adding capacitive loading in the control signal path or reducing the driving power of the digital control logic. By implementing such soft-switching, the change in the resistor values with time would be softened from the sharp edges shown in FIG. 5 and rather as shown in FIG. 9.

Figure 9:
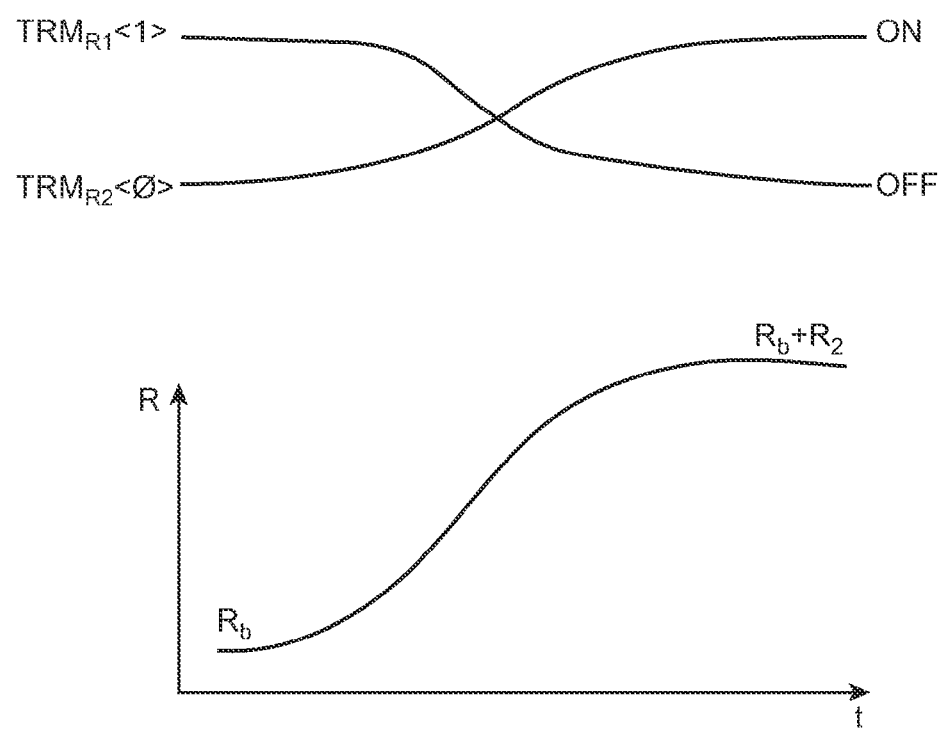
FIG. 9 shows a graph of the change in resistance of the resistor 106 (shown by the y-axis) as a function of time (shown by the x-axis) when employing soft-switching.

FIG. 9 shows a graph of the change in resistance of the resistor 106 (shown by the y-axis) as a function of time (shown by the x-axis) when employing soft-switching. The control signal is two bits, as in FIG. 7, and the most significant bit starts at a '1' state and gradually goes to a '0' or off state and the least significant bit does the opposite by going from a '0' state to gradually, an on state. Soft switching is done by slowing the rise-time and fall-times of the digital control signals. Such an approach, practically, uses weaker logic gates or adding capacitor to the digital control lines to make the logic gates operate slower.

Figure 10:
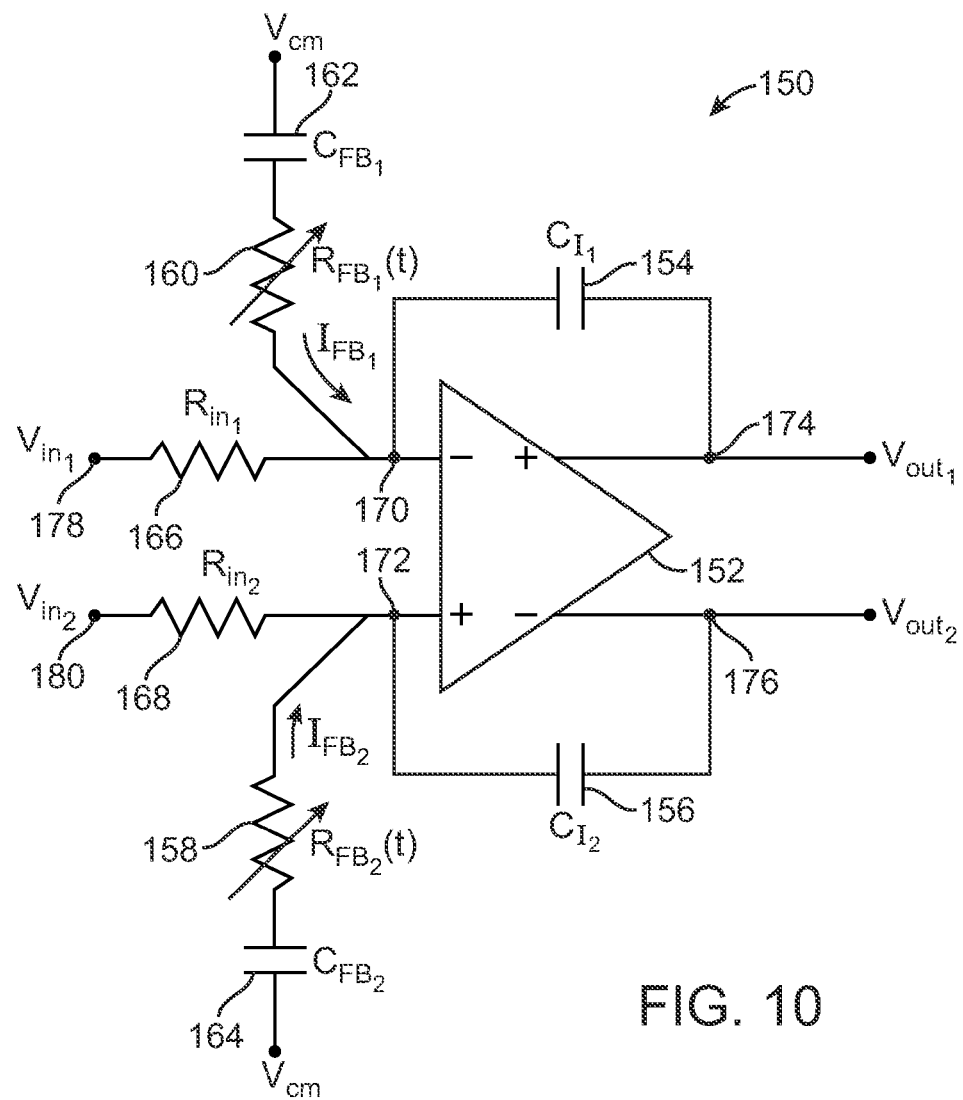
FIG. 10 shows one stage of the Sigma-Delta analog-to-digital converter ADC 100 is shown, in accordance with another embodiment of the present invention.

FIG. 10 shows one stage of a Sigma-Delta ADC 150, in accordance with another embodiment of the present invention. The ADC 150 may be an operational amplifier circuit. In one embodiment of the present invention, the ADC 150 is one stage of a Continuous-Time Sigma-Delta type of converter. The ADC 150 is shown to include an operational amplifier 152, an integration capacitor 154, an integration capacitor 156, a variable feedback resistor 160, a variable feedback resistor 158, a feedback capacitor 162, a feedback capacitor 164, an input resistor 168 and an input resistor 166.

The operation amplifier 152 is shown to be a differential operational amplifier and known to those skilled in the art. It is note that the operational amplifier 102 is not a differential type of amplifier in that it does not have two differential outputs, as does the amplifier 152. The differential aspect of the amplifier 152 serves to cancel out the common-mode noise at the output to enhance the operational amplifier performance.

The amplifier 152 has two input nodes 170 and 172. The capacitor 154 is shown coupled at one end to the output 174 and at another end, to the node 170. The resistor 166 is shown coupled at one end to the input 178 and at another end to the node 170. The capacitor 156 is shown coupled at one end to the output 176 and at another end, to the node 172. The resistor 166 is shown coupled at one end to the input 178 and at another end to the node 170. The resistor 168 is shown coupled at one end to the input 180 and at another end to the node 172. The resistor 160 is shown coupled at one end to the capacitor 162 and at another end to the node 170. The resistor 158 is shown at one end to the capacitor 164 and at another end to the node 172. The capacitor 164 is shown coupled at an end that is not coupled to the resistor 158, to Vcm. Vcm, as used herein, refers to a common-mode voltage. The capacitor 162 is shown coupled at an end that is not coupled to the resistor 160, to Vcm. Thus, the capacitor 162 and the resistor 160 are coupled in series. Similarly, the capacitor 164 and the resistor 158 are coupled in series.

It is understood that the ADC 150 is merely one stage of the ADC and that more than one stage is generally employed.

The operation of the ADC 150 is analogous to that of the ADC 100. As voltage is applied through the inputs 178 and 180, the voltages are each translated into a current through their corresponding resistors. That is the resistor 166 serves to translate the voltage at input 178 to a current and similarly, the resistor 168 serves to translate the voltage at input 180 to a current. The feedback currents, $I_{FB1}(t)$ and $I_{FB2}(t)$, are used to integrate the feedback charge from each of corresponding capacitors. The current $I_{FB1}(t)$ is used to integrate charge from the capacitor 154 and the $I_{FB2}(t)$ is used to integrate charge from the capacitor 164. The operational amplifier 152 serves to amplify the voltage difference at nodes 170 and 172 to that of the outputs 174 and 176, $I_{FB1}(t)$ and $I_{FB2}(t)$, which each change over time in response to the change in the resistances of their respective resistors 160 and 158, is set to reach a value $I_{FB1max}$ and $I_{FB2max}$, respectively, at the outset of the integration time and are maintained substantially at the same level during most of the integration time by adjusting the resistance of the resistors 160 and 158 i.e. as the integration cycle continues, the resistance of resistors 160 and 158 is decreased in such a way that their respective currents $I_{FB1}$ and $I_{FB2}$, do not change substantially.

The resistors 160 and 158, in one embodiment of the present invention, are each programmably changeable in their resistance values. During an integration cycle, the resistance of each of the resistors 160 and 158 is changed in a manner so as to limit the current going through each or $I_{FB1}$ and $I_{FB2}$, at the outset by setting their respective resistances to the substantially maximum value, which effectively slows down the discharging of each of the capacitors 154 and 156 and to reduce the resistance value of each of the resistors 160 and 158 throughout the remainder of the integration cycle to reach substantially a zero-resistance value at the end of the integration cycle (integration stop cycle) where current is reduced to zero to avoid jitter sensitivity. In this manner, the ADC 150 advantageously functions as a hybrid between the feedback approach and the CT feedback approach maintaining and combining the benefits of each approach in that at the beginning of the integration cycle, the ADC 150 utilizes higher current while current is minimized at the end of the integration cycle.

The ADC uses a hybrid of the CT and SC feedback approaches where rather than spiking up the current to a maximum level at the outset, such as done by the SC feedback approach, current level is limited to less than the maximum current so as to avoid requiring a high power consumption in the operational amplifier and as integration stop cycle approaches, minimizing current to avoid jitter sensitivity.

In one embodiment, each of the resistances 160 and 158 is comprised of a combination of resistors in a circuit analogous to that of the embodiment of FIG. 7.

As known by one of ordinary skill in the art, the present invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, and/or schematic capture levels. Examples of HDLs include, but are not limited to: GDS II and OASIS (layout level); various SPICE languages, and IBIS (circuit netlist level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A Sigma-Delta analog-to-digital converter (ADC) having at least one stage with at least one input and at least one output comprising:

an operational amplifier having a first and second input nodes and being responsive to at least one analog input and operative to generate an output;

at least one input resistor coupled between one of the inputs of the ADC stage and the first input node of the operational amplifier;

at least one integration capacitor coupled between at least one of the outputs of the ADC stage and the first node of the operational amplifier, the integration capacitor being discharged during integration cycle;

at least one feedback capacitor having two ends with one end coupled to an alternating current (AC) ground; and at least one variable resistor having a first programmably alterable resistance and being coupled at one end to the first node and at the other end to the other end of the feedback capacitor, wherein when voltage is applied at the at least one analog input, at the outset of the integration time, the first programmably alterable resistance is programmed to a maximum value and reduced during the remainder of the integration time and programmed to substantially zero at the end of the integration time.

2. The Sigma-Delta analog-to-digital converter (ADC), as recited in claim 1, wherein the second input node of the operational amplifier is coupled to an AC ground.

3. The Sigma-Delta analog-to-digital converter (ADC), as recited in claim 1, further including another one of the at least one input resistors coupled between another one of the inputs of the ADC and the second input node of the operational amplifier.

4. The Sigma-Delta analog-to-digital converter (ADC), as recited in claim 3, further including another one of the at least one integration capacitors coupled between another one of the at least one of the outputs of the ADC and the second node of the operational amplifier, the integration capacitor being discharged during integration cycle, another one of the at least one feedback capacitor having two ends with one end coupled to the AC ground, another one of the at least one variable resistors having a second programmably alterable resistance and being coupled at one end to the second node and at the other end to the other end of the another one of the at least one feedback capacitors, wherein when voltage is applied at another one of the at least one analog inputs, at the outset of the integration time, the second programmably alterable resistance is programmed to a maximum value and reduced during the remainder of the integration time and programmed to substantially zero at the end of the integration time.

5. The Sigma-Delta analog-to-digital converter (ADC), as recited in claim 4, wherein the first resistor comprises a first plurality of resistors coupled together in a manner as to have their individual resistances added in various combinations to vary the first programmably alterable resistance and the second programmably alterable resistor comprises a second plurality of resistors coupled together in a manner as to have their individual resistances added in various combinations to vary the second programmably alterable resistance.

6. The Sigma-Delta analog-to-digital converter (ADC), as recited in claim 5, wherein the coupling of the first plurality of resistors is controlled by a first control signal and the coupling of the second plurality of resistors is controlled by a second control signal.

7. The Sigma-Delta analog-to-digital converter (ADC), as recited in claim 1, wherein the first resistor comprises a plurality of resistors coupled together in a manner as to have their individual resistances added in various combinations to vary the resistance of the variable resistor.

8. The Sigma-Delta analog-to-digital converter (ADC), as recited in claim 7, wherein the coupling of the plurality of resistors is controlled by a control signal.

9. The Sigma-Delta analog-to-digital converter (ADC), as recited in claim 7, further including a programmable control logic coupled to vary the resistance of the first resistor.

10. The Sigma-Delta analog-to-digital converter (ADC), as recited in claim 9, wherein the programmable control logic comprises a plurality of transistors corresponding in number to the number of resistances included in the variable resistor wherein turning transistors of the plurality of transistors on and off determines which resistors of the variable resistor determine the resistance thereof.

11. The Sigma-Delta analog-to-digital converter (ADC), as recited in claim 7, further including a first programmable control logic coupled to vary the first programmably alterable resistance and a second programmable control logic coupled to vary the second programmably alterable resistance.

12. The Sigma-Delta analog-to-digital converter (ADC), as recited in claim 11, wherein a first programmable control logic comprises a first plurality of transistors corresponding in number to the number of resistances included in the at least one of the variable resistors wherein turning transistors of the first plurality of transistors on and off determines which resistors of the at least one of the variable resistors determine the first programmably alterable resistance and a second programmable control logic comprises a second plurality of transistors corresponding in number to the number of resistances included in the another one of the at least one of the variable resistors wherein turning transistors of the second plurality of transistors on and off determines which resistors of the another one of at least one of the variable resistors determine the second programmably alterable resistance.

13. A method of controlling the current used for integrating an integration capacitor employed in an Sigma-Delta analog-to-digital converter (ADC) comprising:

receiving a voltage at least one of the inputs of an operational amplifier, the operational amplifier having at least one output coupled to the at least one of the inputs via an at least one integration capacitor;

transforming the voltage to a current;

integrating the current on the at least one of the integration capacitors, during integration time;

varying the resistance of at least one of a variable resistors coupled to the operational amplifier during integration time, wherein the varying step is performed by programmably using an array of capacitors and switches;

at an initial integration cycle, setting the resistance of the at least one of the variable resistors to a maximum value to apply a first feedback current to the at least one of the integration capacitors;

substantially maintaining the level of the first feedback current throughout the integration cycle and up to a time that is a predetermined amount of time prior to the end of the integration cycle;

reducing the resistance of the at least one of the variable resistors to substantially zero at the end of the integration cycle; and soft switching.

14. A computer readable medium that includes a description of a circuit for converting an analog signal to digital form, where at least one of the stages of the circuit comprises:

an operational amplifier having a first and second input nodes and being responsive to at least one analog input and operative to generate an output;

at least one input resistor coupled between one of the inputs of a Sigma-Delta analog-to-digital converter (ADC) and a first input node of an operational amplifier;

at least one integration capacitor coupled between at least one of the outputs of the Sigma-Delta ADC and the first node of the operational amplifier, the integration capacitor being discharged during integration cycle;

at least one feedback capacitor having two ends with one end coupled to an alternate current (AC) ground; and at least one variable resistor having a first programmably alterable resistance and being coupled at one end to the first node and at the other end to the other end of the feedback capacitor, wherein when voltage is applied at the at least one analog input, at the outset of the integration time, the first programmably alterable resistance is programmed to a maximum value and reduced during the remainder of the integration time and programmed to substantially zero at the end of the integration time.

15. The computer readable medium, as recited in claim 14, wherein the second input node of the operational amplifier is coupled to the AC ground.

16. The computer readable medium, as recited in claim 14, further including another one of the at least one input resistors coupled between another one of the inputs of the ADC and the second input node of the operational amplifier.

17. The computer readable medium, as recited in claim 16, further including another one of the at least one integration capacitors coupled between another one of the at least one of the outputs of the Sigma-Delta analog-to-digital converter ADC and the second node of the operational amplifier, the integration capacitor being discharged during integration cycle, another one of the at least one feedback capacitor having two ends with one end coupled to the AC ground, another one of the at least one variable resistors having a second programmably alterable resistance and being coupled at one end to the second node and at the other end to the other end of the another one of the at least one feedback capacitors, wherein when voltage is applied at another one of the at least one analog inputs, at the outset of the integration time, the second programmably alterable resistance is programmed to a maximum value and reduced during the remainder of the integration time and programmed to substantially zero at the end of the integration time.

18. A Sigma-Delta analog-to-digital converter (ADC), at least one of its stages, comprising:

means for receiving a voltage at least one of the inputs of an operational amplifier, the operational amplifier having at least one output coupled to the at least one of the inputs via an at least one integration capacitor;

means for transforming the voltage to a current;

means for integrating the current on the at least one of the integration capacitors, during integration time and varying the resistance of at least one of a variable resistors coupled to the operational amplifier during integration time, wherein the varying step is performed by programmably using an array of capacitors and switches;

at an initial integration cycle, means for setting the resistance of the at least one of the variable resistors to a maximum value to apply a first feedback current to the at least one of the integration capacitors;

substantially maintaining the level of the first feedback current throughout the integration cycle and up to a time that is a predetermined amount of time prior to the end of the integration cycle;

reducing the resistance of the at least one of the variable resistors to substantially zero at the end of the integration cycle; and soft switching.

* * * * *

UNITED STATES PATENT AND TRADEMARK OFFICE
CERTIFICATE OF CORRECTION

| | | |
|---|---|---|
| PATENT NO. | : 7,852,248 B1 | Page 1 of 1 |
| APPLICATION NO. | : 12/331369 | |
| DATED | : December 14, 2010 | |
| INVENTOR(S) | : Mansour Keramat, Ali Agah and Ali Tabatabaei | |

It is certified that error appears in the above-identified patent and that said Letters Patent is hereby corrected as shown below:

Title page, item [73] Assignee should read as follows: Alvand Technologies, Inc., Santa Clara, CA (US)

Signed and Sealed this
First Day of May, 2012

David J. Kappos
*Director of the United States Patent and Trademark Office*